United States Patent
Lin et al.

[11] Patent Number: 5,834,806
[45] Date of Patent: Nov. 10, 1998

[54] RAISED-BITLINE, CONTACTLESS, TRENCHED, FLASH MEMORY CELL

[75] Inventors: Ruei-Ling Lin, Kaohsiang; Ching-Hsiang Hsu; Mong-Song Liang, both of Hsin-Chu, all of Taiwan

[73] Assignee: Taiwan Semiconductor Manufacturing Company, Ltd., Hsin-Chu, Taiwan

[21] Appl. No.: 873,833

[22] Filed: Jun. 12, 1997

Related U.S. Application Data

[62] Division of Ser. No. 766,079, Dec. 16, 1996, Pat. No. 5,679,591.

[51] Int. Cl.$^6$ .................. H01L 27/108; H01L 29/788
[52] U.S. Cl. .................. 257/306; 257/316; 257/317; 257/318; 257/319; 257/322; 257/506; 257/524
[58] Field of Search .................. 257/316, 317, 257/318, 319, 320, 321, 322, 510, 524; 259/499, 506

[56] References Cited

U.S. PATENT DOCUMENTS

| | | | |
|---|---|---|---|
| 5,282,160 | 1/1994 | Yamagata | 257/316 |
| 5,338,956 | 8/1994 | Nakamura | 257/322 |
| 5,341,342 | 8/1994 | Brahmbhatt | 257/316 |
| 5,399,891 | 3/1995 | Yiu et al. | 257/316 |
| 5,432,740 | 7/1995 | D'Arrigo et al. | 257/317 |
| 5,470,779 | 11/1995 | Yoo | 437/52 |
| 5,589,413 | 12/1996 | Sung et al. | 437/43 |
| 5,675,176 | 10/1997 | Ushiku et al. | 257/510 |

OTHER PUBLICATIONS

Y. Hisamune et al, "A 3.6 $\mu m^2$ Memory Cell Structure for 16MB EPROMs" IEDM (1989) pp. 583–586.

*Primary Examiner*—Carl W. Whitehead, Jr.
*Attorney, Agent, or Firm*—George O. Saile; Stpehen B. Ackerman; Graham S. Jones, II

[57] ABSTRACT

A raised-bitline, contactless flash memory device with trenches on a semiconductor substrate doped with a first conductivity type includes a first well of an opposite conductivity type comprising a deep conductor line to a device, and a second well of the first conductivity type above the first well comprising a body line to the device. Deep trenches extend through the second well into the first well. The trenches are filled with a first dielectric. There are gate electrode stacks for a flash memory device including a gate oxide layer over the device. First doped polysilicon floating gates are formed over the gate oxide layer. An interpolysilicon dielectric layer is formed over floating gate electrodes, and control gate electrodes formed of doped polysilicon layer overlie the interpolysilicon dielectric layer. A dielectric cap overlies the control gate electrodes. Source/drain regions are formed in the second well self-aligned with the stacks as well as spacer dielectric structures formed adjacent to the sidewalls of the stacks. A third doped polysilicon layer patterned into raised bitlines overlies source/drain regions.

9 Claims, 9 Drawing Sheets

CELL

FIG. 16A – Prior Art

NOR

FIG. 16B – Prior Art

CONTACTLESS NOR

RAISED-BITLINE, CONTACTLESS, TRENCHED, FLASH MEMORY CELL

This application is a division of Ser. No. 08/766,079 filed Dec. 16, 1996 now U.S. Pat. No. 5,679,591.

BACKGROUND OF THE INVENTION

1. Field of the Invention

This invention relates to semiconductor memory devices and more particularly to bit-line connection thereto.

2. Description of Related Art

Y. Hisamune, et al. "A 3.6 $\mu m^2$ Memory Cell Structure for 16MB EPROMs", IEDM (1989), pp. 583–586 describes a floating gate memory EPROM (Erasable Programmable Read Only Memory) cell using features including an isolation trench filled with BPSG (Boro-Phospho Silicate Glass), ONO (silicon Oxide/silicon Nitride/silicon Oxide) interpolysilicon dielectric, and bit-line contact to a silicide pad by means of a tungsten plug formed above the silicide pad.

U.S. Pat. No. 5,399,891 Yiu et al. for "Floating Gate or Flash EPROM Transistor Array Having Contactless Source and Drain Diffusions" describes a contactless flash EPROM cell where a single source diffusion is shared by two columns of transistors. Drain diffusions are coupled through a top block select transistor to a global bitline.

U.S. Pat. No. 5,470,779 of Yoo for "Method of Manufacture of SRAM with SIPOS Resistor" describes a method of manufacturing an SRAM cell with a resistor comprised of first polysilicon layer.

It is difficult to scale down "source erase" in NOR type flash memory devices and "drain program" in available NAND type flash memory devices as well as AND flash memory devices.

SUMMARY OF THE INVENTION

This invention pertains to a method and process for manufacture of a raised-bitline, contactless, trench, flash, channel program device.

Yiu et al. does not teach a raised bitline and transistor configuration and Yoo does not discuss a raised contact bitline.

An advantage of this invention is a flash memory cell in which the size of cells is scaled down since there is no large voltage difference across the source and the drain during programming.

Another advantage of this invention is a cell which can perform channel program and channel erase in NOR-type flash memory devices.

Still another advantage of this invention is a cell which can be easily scaled down due to the use of channel program and erase, instead of a source erase and/or drain program.

In accordance with another aspect of this invention, 26. A device comprising a raised-bitline, contactless flash memory device with trenches. The device includes a semiconductor substrate doped with a first P− conductivity type, a first well of an opposite N− conductivity type and a second well of the first P− conductivity type formed over the first well.

Deep trenches formed with a depth of from about 8 $\mu m$ to about 10 $\mu m$ and a width from about 0.3 $\mu m$ to about 0.5 $\mu m$ extend through the second well into the first well. The trenches are filled with a blanket, CVD, first dielectric layer comprising a BPSG planarized glass layer with a thickness of from about 10 $\mu m$ to about 12 $\mu m$. The BPSG layer is composed of boron (B) from about 1% to about 12% and phosphorous (P) from about 4% to about 6%. A gate oxide layer is formed over the device having a thickness from about 80 Å to about 90 Å over which is formed a first doped polysilicon layer over the gate oxide layer having a thickness from about 1,500 Å to about 1,800 Å.

The first doped polysilicon layer is patterned. An interpolysilicon dielectric (IPD) layer is formed over first doped polysilicon layer, the IPD layer comprising an oxide/nitride/oxide layer comprising a thermally formed silicon oxide layer having a thickness of from about 60 Å to about 80 Å, a silicon nitride layer having a thickness of from about 80 Å to about 100 Å, and another thermally formed silicon oxide having a thickness from about 60 Å to about 80 Å.

There is a second doped polysilicon layer formed over the interpolysilicon dielectric layer having a thickness from about 1,500 Å to about 2,000 Å. A polycide layer, preferably composed of tungsten silicide, is formed over the second doped polysilicon layer having a thickness from about 100 Å to about 180 Å. Dielectric cap layers are formed over the polycide layer. The dielectric cap layers comprise a blanket thin pad oxide layer composed of silicon dioxide from about 200 Å to about 400 Å thick and a blanket silicon nitride layer from about 800 Å to about 1,000 Å thick. The device has gate electrode stacks for a flash memory device formed with the cap layers on top.

There are N− lightly doped source/drain regions in the second well self-aligned with the gate electrode stacks with a dopant concentration from about 5E17 ions/cm$^3$ to about 5E18 ions/cm$^3$. Spacer dielectric structures are formed adjacent to the sidewalls of the stacks. Source/drain regions which are self-aligned with the spacers are formed in the second well having a dopant concentration from about 5E19 atoms/cm$^3$ to about 5E20 atoms/cm$^3$.

A third doped polysilicon layer is formed over the device formed into raised bitlines from the third doped polysilicon layer over the source/drain regions to form raised bitlines having a thickness between about 0.2 $\mu m$ and about 0.3 $\mu m$.

BRIEF DESCRIPTION OF THE DRAWINGS

The foregoing and other aspects and advantages of this invention are explained and described below with reference to the accompanying drawings, in which:

FIG. 15B shows the flash memory device associated with a stack emphasizing the functions of cell operation as indicated in TABLES I and II and in FIGS. 18A–18C.

DESCRIPTION OF THE PREFERRED EMBODIMENT

Cell Process

Figure 1:
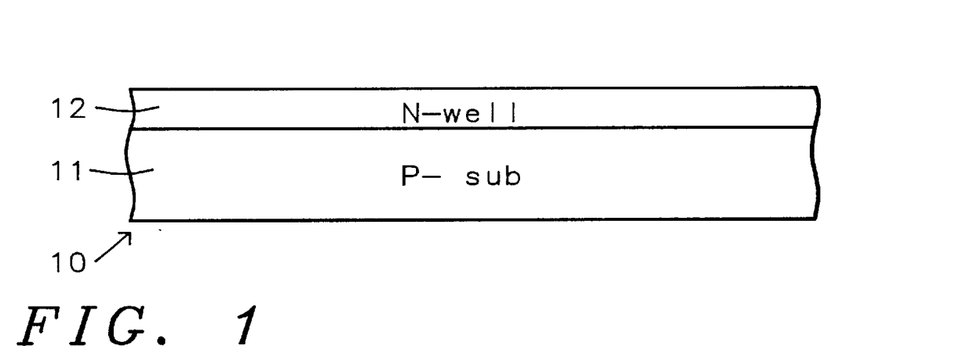
FIG. 1 shows a device in accordance with this invention with a P− doped silicon substrate in which an N-well with N type dopant atoms has been formed over the substrate in an initial step of manufacture thereof.

FIG. I shows a device 10 comprising a P− doped silicon substrate 11 in which an N-well 12 with N type dopant atoms has been formed over the substrate 11 in an initial step of manufacture thereof.

Figure 2:
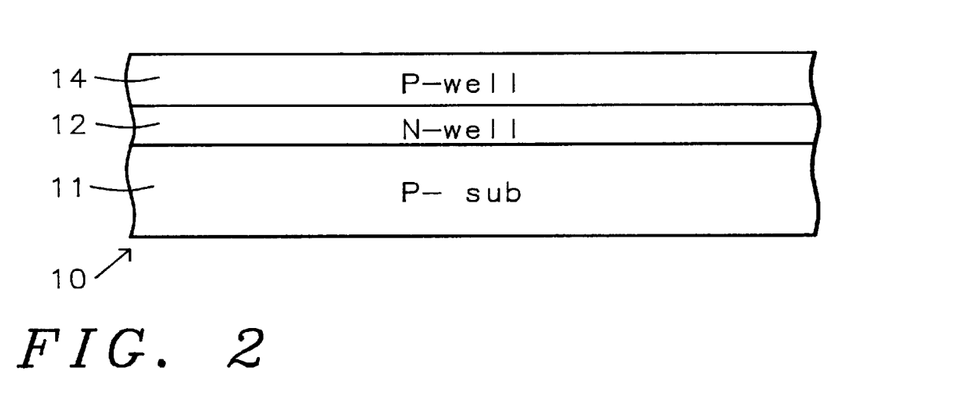
FIG. 2 shows the device of FIG. 1 after a P-well with P type dopant atoms has been formed over the N-well providing a stack of a P-well layer on top of an N-well layer on top of the P− doped silicon substrate, referred to hereinafter as a "triple well" structure.

FIG. 2 shows the device 10 of FIG. 1 after a P-well 14 with P type dopant atoms has been formed over the N-well 12 providing a stack of a P-well layer 14 on top of an N-well layer 12 on top of the P− doped silicon substrate 11, referred to hereinafter as a "triple well" structure.

Figure 3:
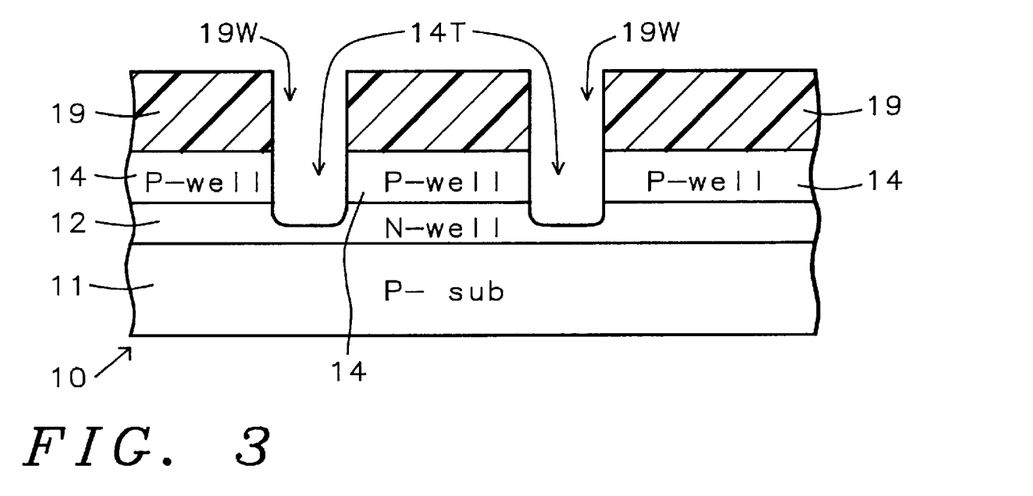
FIG. 3 shows the device of FIG. 2 after a mask has been formed with trench windows which have been used to etch conventional deep trench openings through the P-well and extending partially down into the N-well of the device splitting the P-well into a parallel array of P-wells filled with glass trench isolation strips.

FIG. 3 shows the device 10 of FIG. 2 after a mask 19 has been formed with trench windows 19W which have been used to etch conventional deep trench openings 14T through the P-well 14 and extending partially down into N-well 12 in device 10 splitting P-well 14 into a parallel array of P-wells 14a, 14b, 14c. Trench openings 14T produced by the etching process have a depth of from about 8 $\mu$m to about 10 $\mu$m and a width from about 0.3 $\mu$m to about 0.5 $\mu$m.

Figure 4:
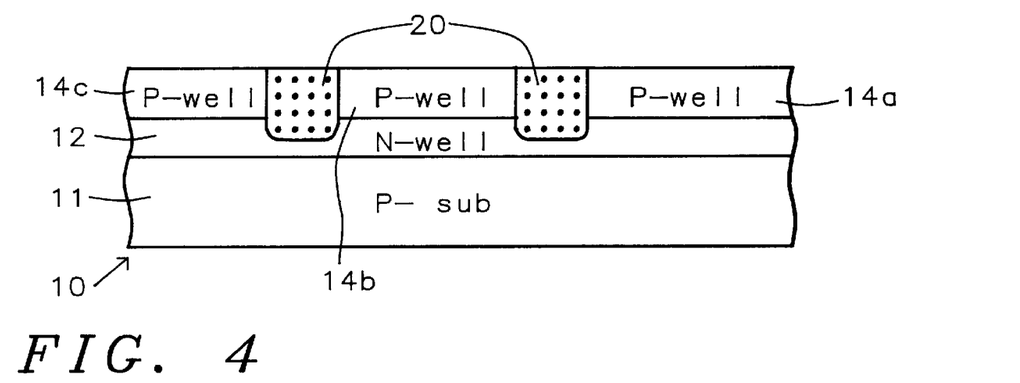
FIG. 4 shows a blanket gate oxide layer grown covering the P-wells as well as covering the glass trench isolation strips followed by formation of a blanket first polysilicon layer is deposited.

After the deep trench openings 14T have been formed the next step is to fill the openings 14T with glass by depositing a glass layer from which glass trench isolation strips 20 of FIG. 4 are formed. To form glass trench isolation strips 20, initially, a blanket BPSG glass layer 20 is formed with a thickness of from about 10 $\mu$m to about 12 $\mu$m. The BPSG glass layer 20 is composed of boron (B) from about 1% to about 12%, phosphorous (P) from about 4% to about 6% and silicon dioxide formed by a CVD (Chemical Vapor Deposition) deposition process selected from APCVD (Atmospheric Pressure CVD), PECVD (Plasma Enhanced CVD), LPCVD (Low Pressure CVD) which deposits BPSG or the equivalent. The device is next heated to reflow the BPSG layer 20 a temperature of from about 850° C. to about 950° C. to planarize the glass layer, after which an RIE (Reactive Ion Etching) etchback process is performed to remove from about 10 $\mu$m to about 12 $\mu$m of the surface of the BPSG layer 20 leaving the BPSG trench strips 20, yielding the device as seen in FIG. 4. This etching step removes the BPSG glass down to the surface of P-wells 14a, 14b, 14c. When the original BPSG film 20 having a thickness from about 10 μm to about 12 μm (measured from the P-well surface) the effective thickness within the trench regions is about 20 μm or more. That is why there is 10 μm of BPSG left in the trenches after during a 10 μm to about 12 μm etch-back of the BPSG film 20.

Next, referring again to FIG. 4, a blanket gate oxide (silicon dioxide) layer 21 is grown covering the P-wells 14a, 14b, 14c as well as covering the glass trench isolation strips 20 followed by formation of a blanket first polysilicon layer 22 is deposited.

The gate oxide layer 21 is from about 80 Å to about 90 Å thick. The first polysilicon layer 22 is from about 1,500 Å to about 1,800 Å thick.

Figure 5:
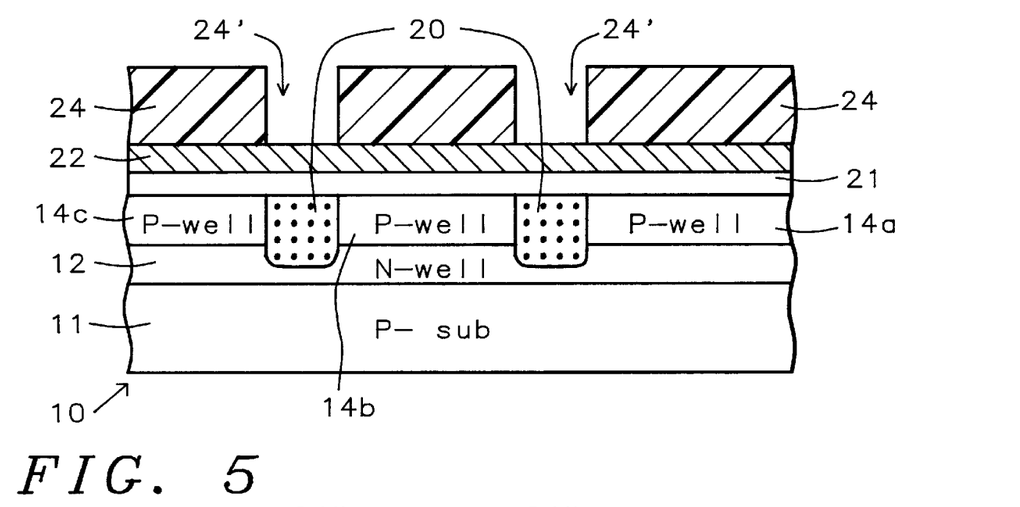
FIG. 5 shows the device 10 of FIG. 4 after formation of a photoresist mask with openings therethrough formed over the first polysilicon layer located over the glass trench isolation strips are formed for patterning of the first polysilicon layer with openings seen in FIG. 6.

FIG. 5 shows the device 10 of FIG. 4 after formation of a photoresist mask 24 with openings 24' therethrough formed over the first polysilicon layer 22. Openings 24', which are located over the glass trench isolation strips 20, are formed for patterning of the first polysilicon layer 22 with openings 24" seen in FIG. 6. During the process of etching the first polysilicon layer 22, the gate oxide layer 21 is used as an etch stop material. The slight undercut of the gate oxide layer 21 caused by etching of first polysilicon layer 22 leaves the thinner regions 21' of gate oxide layer 21 above the glass trench isolation strips 20.

Figure 6:
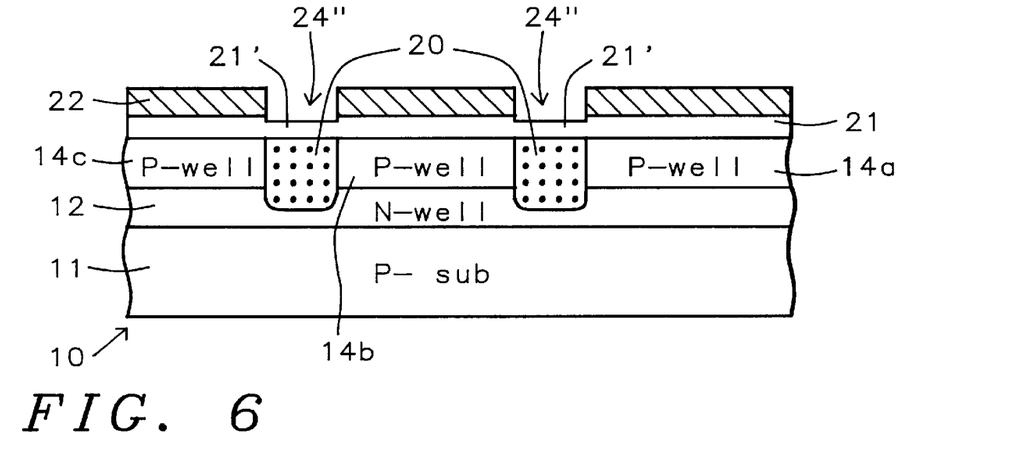
FIG. 6 shows the device of FIG. 5 after the openings in the mask were used to etch slot holes (openings) through the first polysilicon layer down to the surface of the gate oxide layer above the glass trench isolation strips.

FIG. 6 shows the device 10 of FIG. 5 after the openings 24' in mask 24 had been used to etch slot holes (openings) 24" through the first polysilicon layer 22 down to the surface of the gate oxide layer 21 above the glass trench isolation strips 20. The mask 24 has been stripped from device 10 leaving the first polysilicon layer 22 patterned by slot holes (openings) 24" etched through the holes 24' in the mask 24.

In addition, the direction of a word line perpendicular to the p-well strip is desired. In accordance with the reasons stated above, the second etch direction is perpendicular to the etch described here. That is why the pattern of the first polysilicon layer 22 is the same pattern as that of the P-well trenches.

Figure 7:
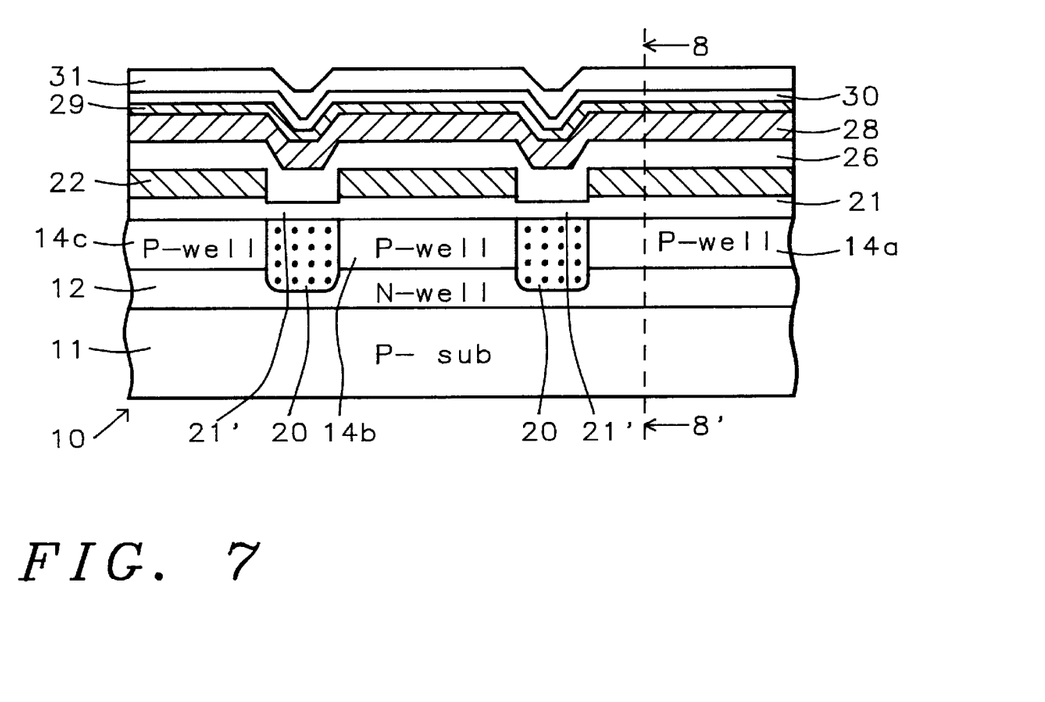
FIG. 7 shows the device of FIG. 6 with the first polysilicon layer covered with a blanket conventional interpolysilicon dielectric layer and a blanket layer of a second polysilicon layer and a polycide layer. There are layers of material for forming a dielectric cap for the gate electrode stacks of FIGS. 9 et seq. formed over the polycide layer which will provide a support for the raised-bitline to be formed following the formation of spacers, etc.

FIG. 7 shows the device 10 of FIG. 6 after deposition of a blanket conventional interpolysilicon, dielectric (ONO) layer 26 on the first polysilicon layer 22 and on the exposed surface of the glass trench isolation strips 20. When the dielectric layer 26 is composed of ONO (silicon Oxide/silicon Nitride/silicon Oxide), then the layer 26 comprises a conventional interpolysilicon dielectric formed of an "O" layer of thermal silicon oxide having a thickness of from about 60 Å to about 80 Å, an "N" layer of a silicon nitride having a thickness of from about 80 Å to about 100 Å, and another "O" layer of thermal silicon oxide having a thickness of from about 60 to about 80 Å.

Then a blanket layer of an in-situ doped second polysilicon layer 28 from about 1,500 Å to about 2,000 Å thick and a blanket polycide layer 29 from about 100 Å to about 180 Å thick, preferably composed of tungsten silicide, are formed.

Next, layers of material forming a dielectric cap for the gate electrode stacks are formed over the polycide layer 29 which will provide a support for the raised-bitline to be formed following the formation of spacers, etc. The layers of material for forming a dielectric cap for the gate electrode stacks ST1 and ST2 (see FIGS. 9 et seq.) are formed over the polycide layer 29. The dielectric cap layers comprise blanket thin pad oxide (silicon dioxide) layer 30 from about 200 Å to about 400 Å thick and a blanket silicon nitride layer 31 from about 800 Å to about 1,000 Å thick, which are deposited covering the second polysilicon layer 28 and polycide layer 29. The pad oxide (silicon dioxide) layer 30 and silicon nitride layer 31 are used to provide a support for the raised-bitline to be formed following the formation of spacers, etc.

Figure 8:
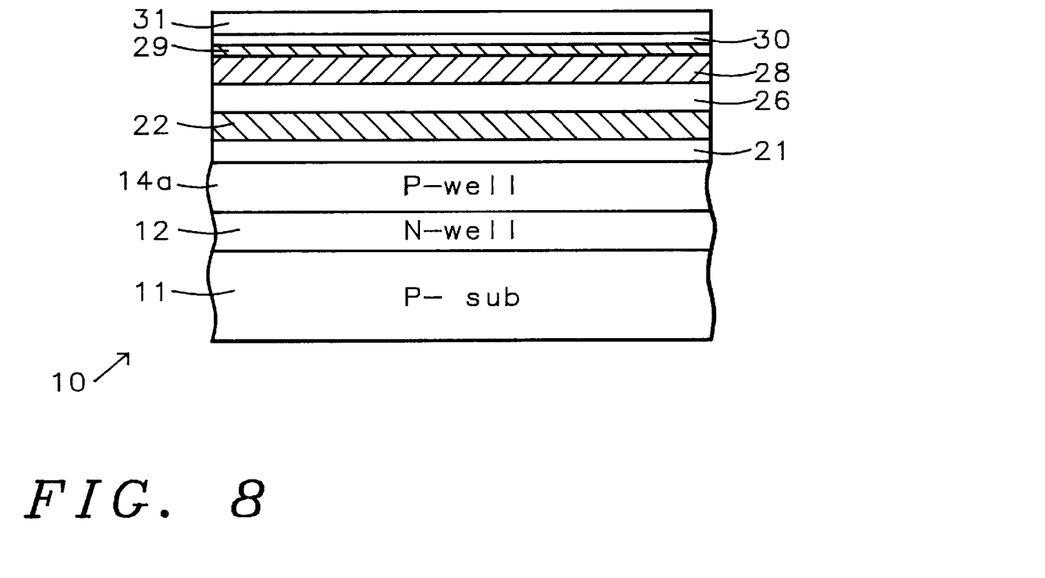
FIG. 8 shows a sectional view of the device of FIG. 7 taken along line B–B' in FIG. 7, which is spaced away from the glass trench isolation strips.

FIG. 8 shows a sectional view of the device of FIG. 7 taken along line 8–8' in FIG. 7, which is spaced away from the glass trench isolation strips 20.

Figure 9:
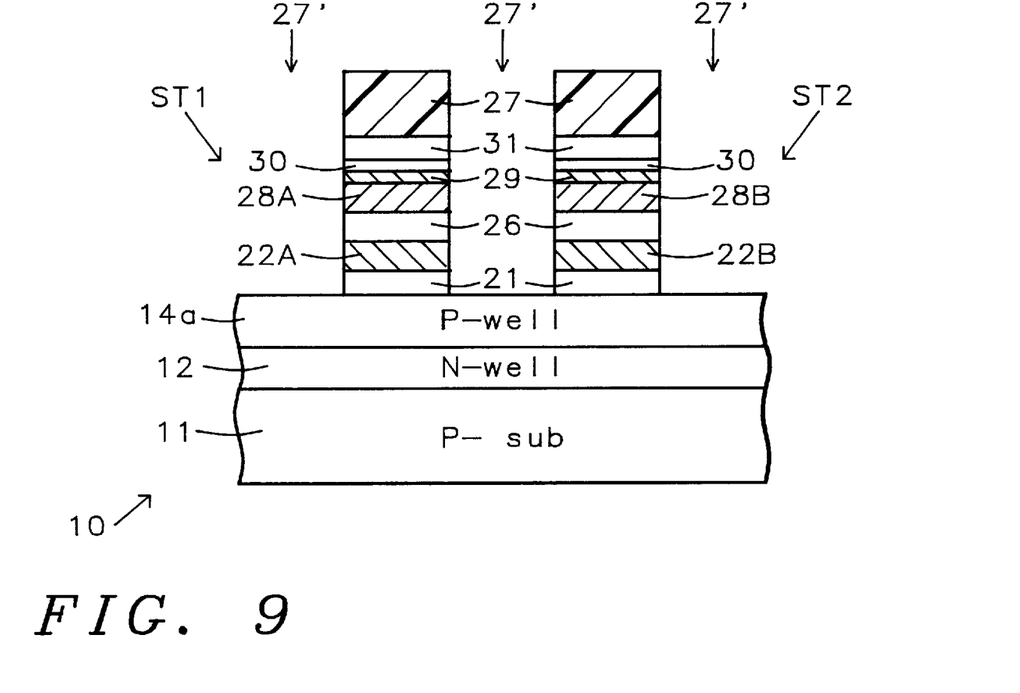
FIG. 9 shows the device of FIG. 7 after formation of a mask over the dielectric cap with openings through the mask, aside from the desired location of gate electrode stacks, which have been formed, as shown in FIG. 9 by etching of the stacks including the cap dielectric layers the polycide layer, second polysilicon layer, ONO layer, first polysilicon layer, and gate oxide layer down to the top surface of P-well. The etching which forms the gate electrode stacks creates, from the first polysilicon layer, a pair of floating gate electrodes. In addition, the etching creates the second polysilicon layer to form first control gate electrode (first word line) and second control gate electrode (second word line).

FIG. 9 shows the device 10 of FIG. 9 after formation of a photoresist mask 27 over the silicon nitride layer 31 with openings 27' through mask 27, aside from the desired location of gate electrode stacks ST1 and ST2, which have been formed, as shown in FIG. 9 by etching of silicon nitride layer 31, pad oxide layer 30, polycide layer 29, second polysilicon layer 28, ONO layer 26, first polysilicon layer 22, and gate oxide layer 21 down to the top surface of P-well 14a. The etching which forms the gate electrode stacks ST1 and ST2 creates, from the first polysilicon layer 22, a pair of floating gate electrodes 22A (FG1) and 22B (FG2). In addition, the etching creates the second polysilicon layer 28 to form first control gate electrode 28A (word line WL1) and second control gate electrode 28B (word line WL2).

Figure 10:
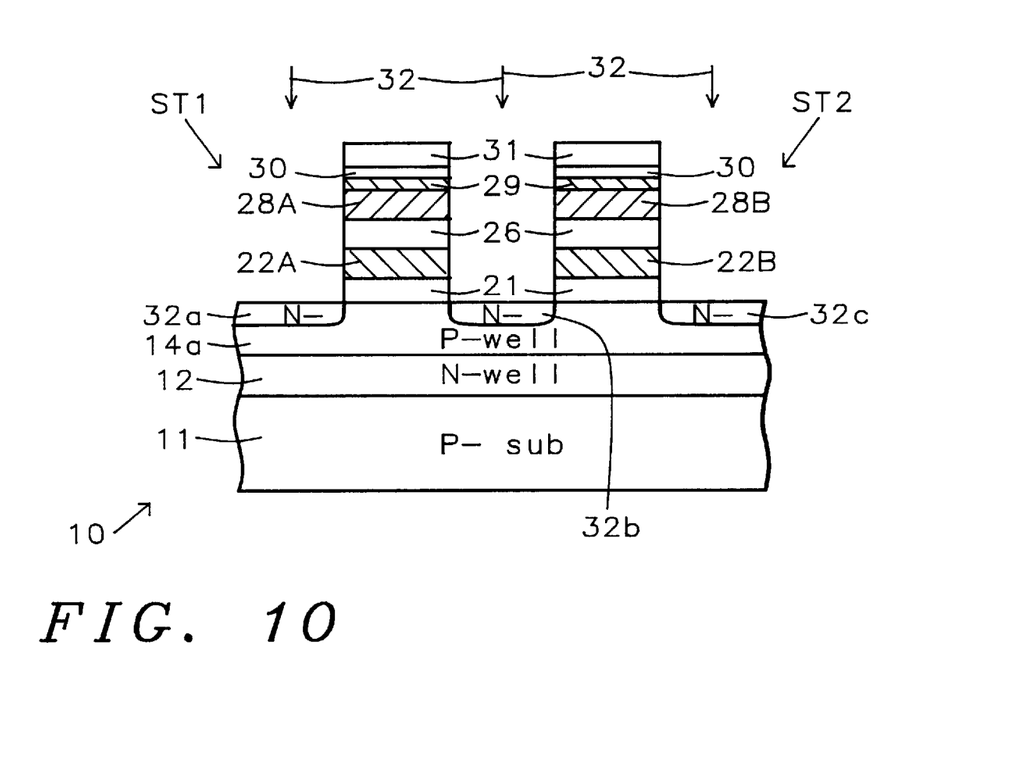
FIG. 10 shows the device 10 of FIG. 9 during self-aligned implantation of ions to form N− lightly doped source/drain regions between the gate electrode stacks and on either side thereof.

FIG. 10 shows the device 10 of FIG. 9 during self-aligned implantation of ions 32 to form N– lightly doped source/drain regions 32a, 32b and 32c between the gate electrode stacks ST1 and ST2 and on either side thereof. Preferably, ions 32 are implanted at an energy from about 30 keV to about 40 keV with a dose of from about 5E13 ions/cm$^2$ to about 5E14 ions/cm$^2$. After the usual annealing, the concentration of the dopant is from about 5E17 atoms/cm$^3$ to about 5E18 atoms/cm$^3$.

Figure 11:
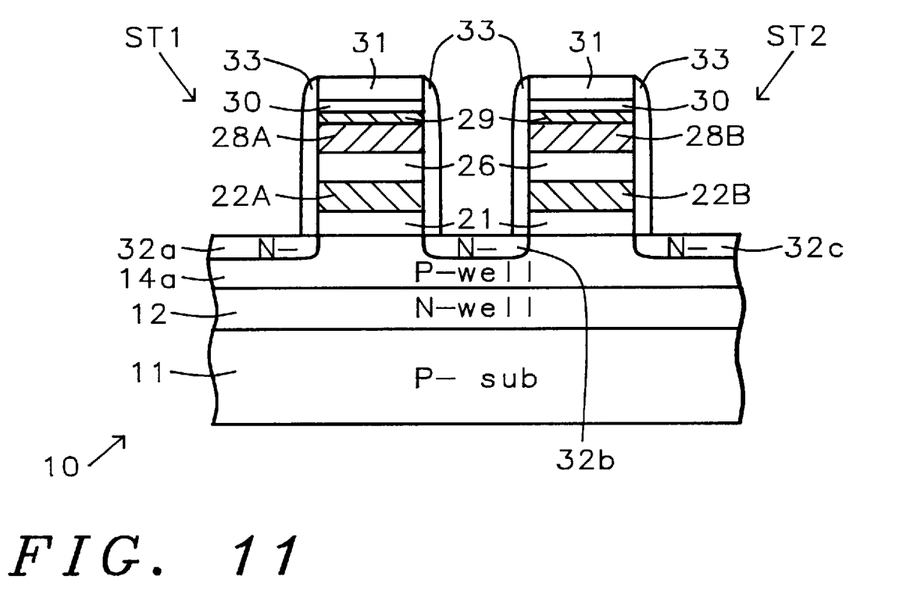
FIG. 11 shows the device of FIG. 10 after a set of silicon dioxide spacers have been formed adjacent to the sidewalls of the gate electrode stacks. The spacers are formed by a conventional process including first forming a blanket silicon dioxide layer and then etching back the blanket spacer layer leaving the spacers adjacent to the sidewalls of the stacks.

FIG. 11 shows the device 10 of FIG. 10 after a set of silicon dioxide spacers 33 have been formed adjacent to the sidewalls of the gate electrode stacks ST1 and ST2. The spacers 33 are formed by a conventional process including first forming a blanket silicon dioxide layer and then etching back the blanket spacer layer leaving the spacers 33 adjacent to the sidewalls of the stacks ST1 and ST2.

Figure 12:
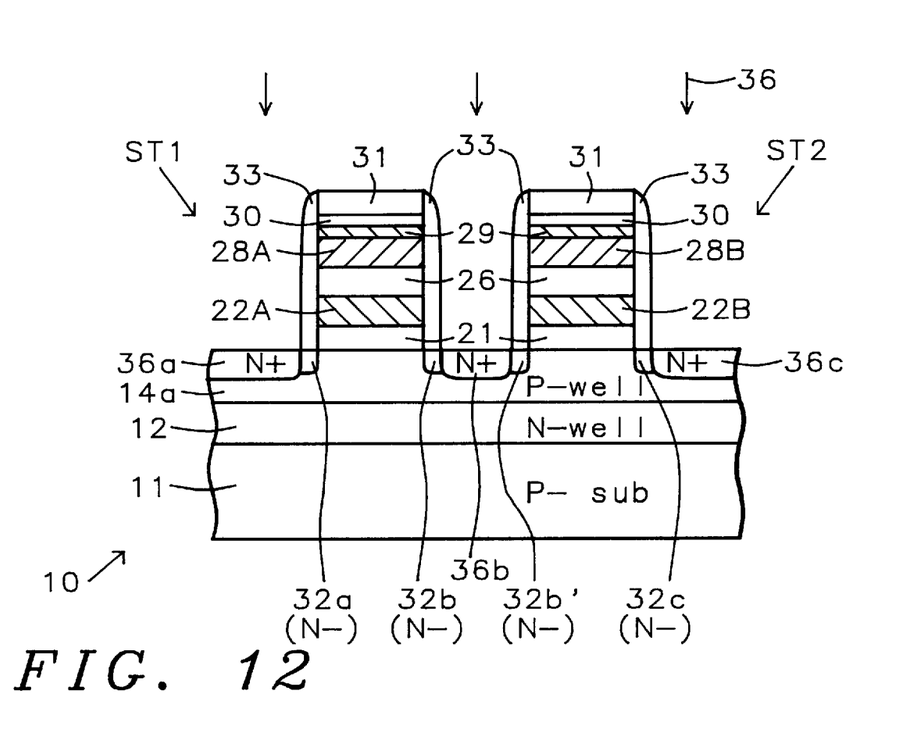
FIG. 12 shows the device of FIG. 11 during self-aligned implantation of ions to form N+ doped source/drain regions between gate electrode stacks and on either side thereof spaced therefrom by the spacers.

FIG. 12 shows the device 10 of FIG. 11 during self-aligned implantation of ions 36 to form N+ doped source/drain regions 36a, 36b and 36c between gate electrode stacks ST1 and ST2 and on either side thereof spaced therefrom by the spacers 33. The ions 36 are preferably implanted at an energy from about 40 keV to about 50 keV with a dose of from about 1E15 ions/cm$^2$ to about 5E15 ions/cm$^2$. After the usual annealing, the concentration of the dopant is from about 5E19 atoms/cm$^3$ to about 5E20 atoms/cm$^3$.

Figure 13:
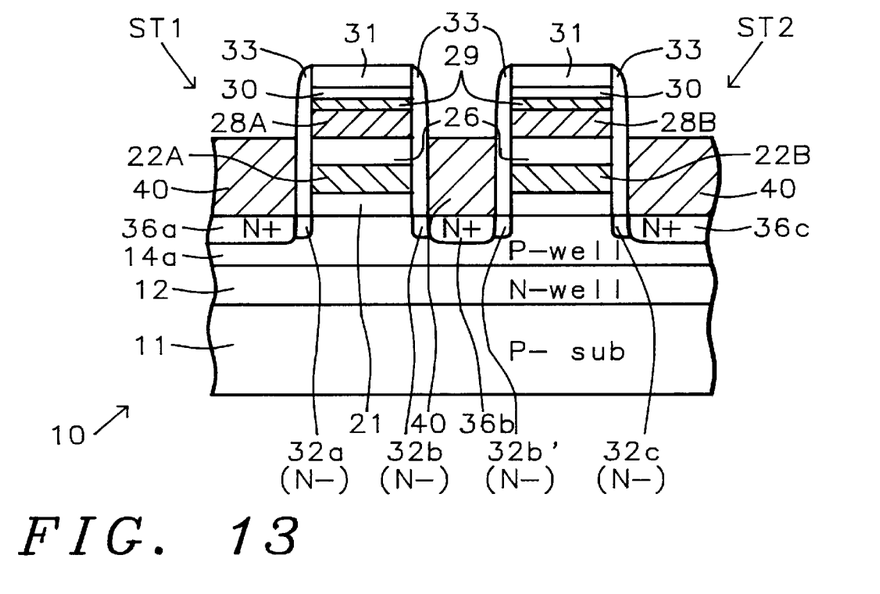
FIG. 13 shows the device of FIG. 12 after blanket deposition of a third doped polysilicon layer in direct contact with the source/drain regions and covering the spacers and the silicon nitride layer above the stacks.

FIG. 13 shows the device 10 of FIG. 12 after blanket deposition of a third doped polysilicon layer 40 with a thickness from about 2 μm to about 3 μm in direct contact with the source/drain regions 36a, 36b and 36c and covering the spacers 33 and the silicon nitride layer 31 above the stacks ST1 and ST2.

Figure 14:
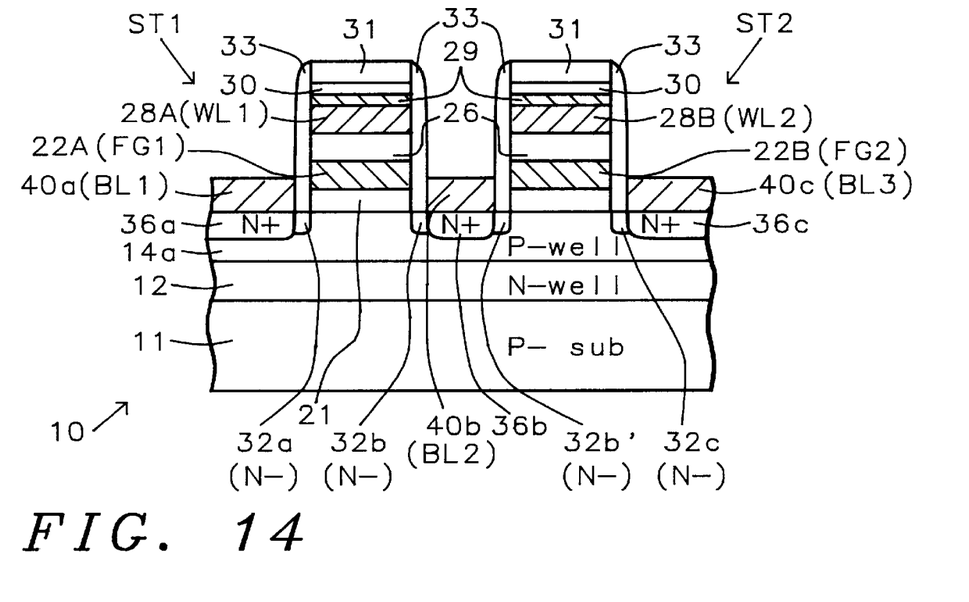
FIG. 14 shows the device of FIG. 13 with raised bitlines for connections to the source/drain regions. The raised bitlines are formed by etching back the polysilicon layer over the source and drain regions with each bitline separate from the other bitlines. The cap layer has silicon nitride layers serving as self-aligned shielding masks during the etching of layer.

FIG. 14 shows the device 10 of FIG. 13 with raised bitlines 40a, 40b, 40c for connections to the source/drain regions 36a, 36b and 36c. The raised bitlines are formed by etching back the polysilicon layer 40 down to a thickness from about 0.2 μm to about 0.3 μm source/drain regions 36a, 36b and 36c forming bitlines 40a, 40b, 40c over those source and drain regions with each bitline 40a, 40b, 40c separate from the other bitlines. Silicon nitride layers 31 serve as self-aligned shielding masks during the etching of layer 40.

Finally, back-end processes are employed. Steps include depositing silicon dioxide, forming metal interconnections, passivation, and forming bonding pad openings.

SUMMARY

After forming the triple well structure of FIG. 2, deep trench strips 20 of FIG. 4 are formed.

Figure 15A:
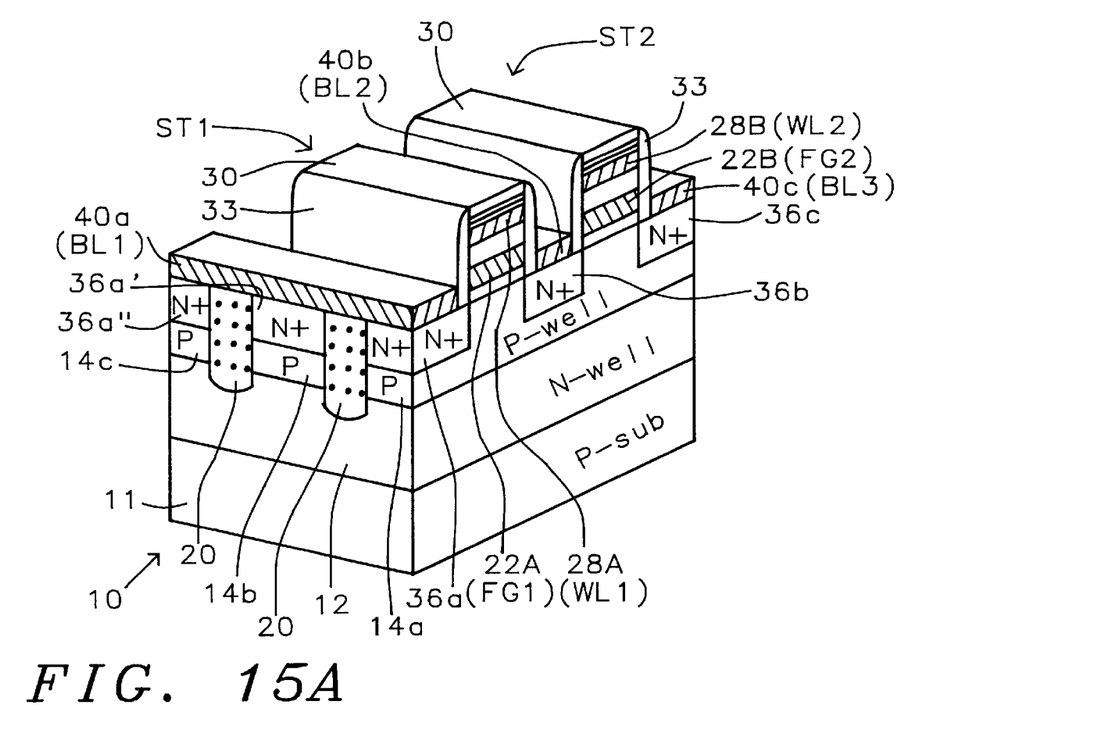
FIGS. 15A and 15B each show a perspective view of a fragment of a device manufactured in accordance with the process of FIGS. 1–14.
Figure 15B:
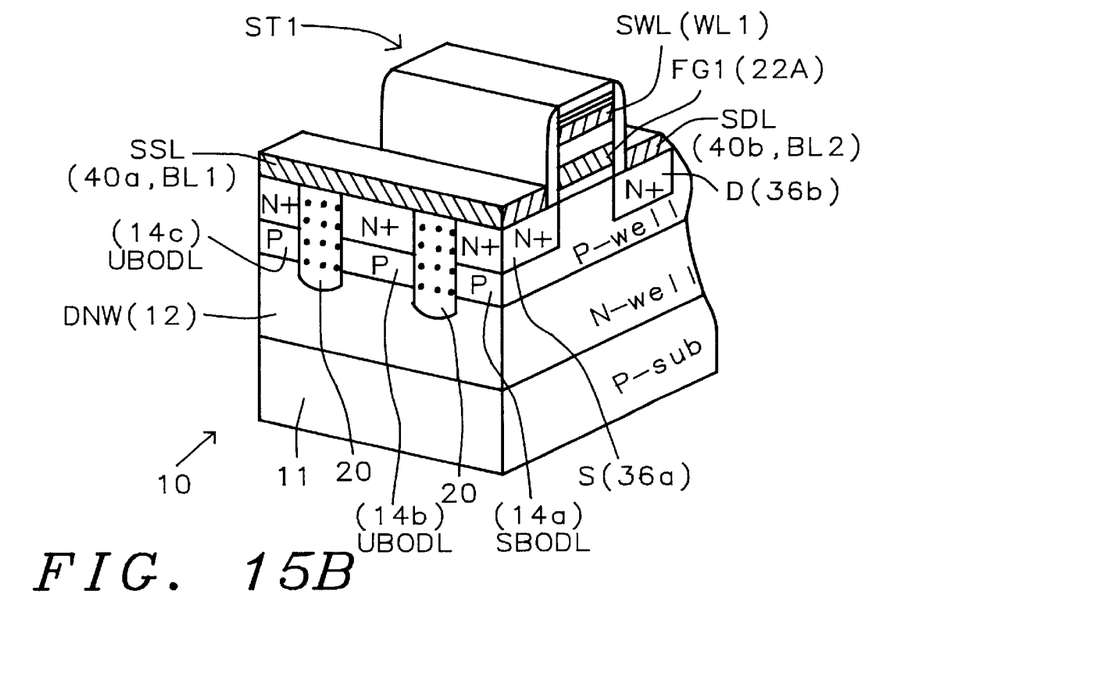

FIGS. 15A and 15B each show a perspective view of a fragment of a device manufactured in accordance with the process of FIGS. 1–14. FIG. 15B shows the flash memory device associated with stack ST1 emphasizing the functions of cell operation as indicated in TABLES I and II and in FIGS. 18A–18C, where it is shown that due to the triple well technology of this invention, cell selection can be achieved by gate and body lines, instead of gate and drain lines. The bitlines 40a (BL1), 40b (BL2), 40c (BL3) are formed as flat bars on the top surfaces of the source/drain regions 36a, 36a', 36a" and the glass trench isolation strips 20.

The parts of the devices seen in FIGS. 15A and 15B have been given additional designations which are described in TABLE I below to designate the function of the different structures in the device.

TABLE I

Selected WL (SWL, 28A, WL1)
Unselected WL (UWL, 28B, WL2)
Selected Body Line (SBODL, 14a, P-well)
Unselected Body Line (UBODL, 14b & 14c P-wells)
Selected Drain Line (SDL, 40b, BL2)
Selected Source Line (SSL, 40a, BL1)
Deep N Well (DNW, 12, N-well)

Cell Operation

|  | Program | Erase | Read |
|---|---|---|---|
| Selected Word Line (SWL) | 8–9 V | −5 V | 5 V |
| Unselected Word Line (UWL) | 0 V | 0 V | 0 V |
| Selected Body Line (SBODL) | −5~−6 V | 10 V | 0 V |
| Unselected Body Line (UBODL) | 0 V | 5~6 V | −5 V |
| Selected Drain Line (SDL) | 0 V | 10 V | 1 V |
| Selected Source Line (SSL) | 2–3 V | 10 V | 0 V |
| Deep N Well (DNW) | −5~−6 V | 10 V | 0 V |

Figure 18A:
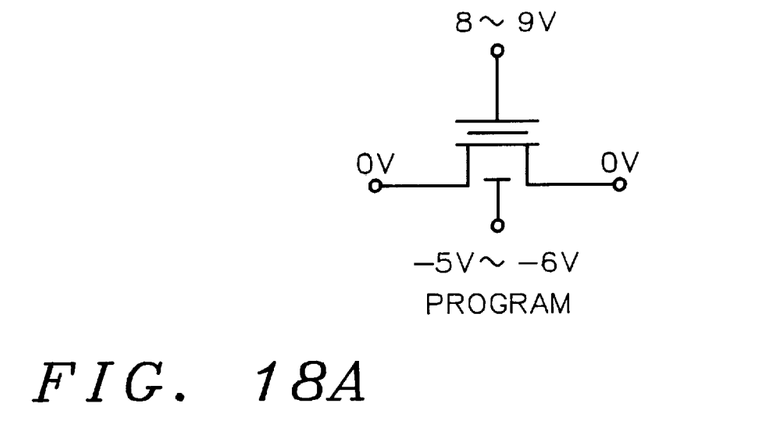
FIG. 18A shows a schematic diagram of a flash memory device in accordance with FIGS. 15A and 15B in the program mode, with the PROGRAM voltages for a device in accordance with Table I.

FIG. 18A shows a schematic diagram of a flash memory device in accordance with FIGS. 15A and 15B in the program mode, with the PROGRAM voltages for a device in accordance with Table I. The selected source line SSL (BL1, 40a) and drain line SDL (BL2, 40b) provide a voltage of 0 Volts at the source 40a and the drain 40b. The word line WL1 is at a voltage of 8 to about 9 Volts. The selected body line SBODL (14a, channel C in FIG. 15B) is from about −5 to about −6 Volts, and the deep N-well DNW (12) is from about −5 to about −6 Volts.

Figure 18B:
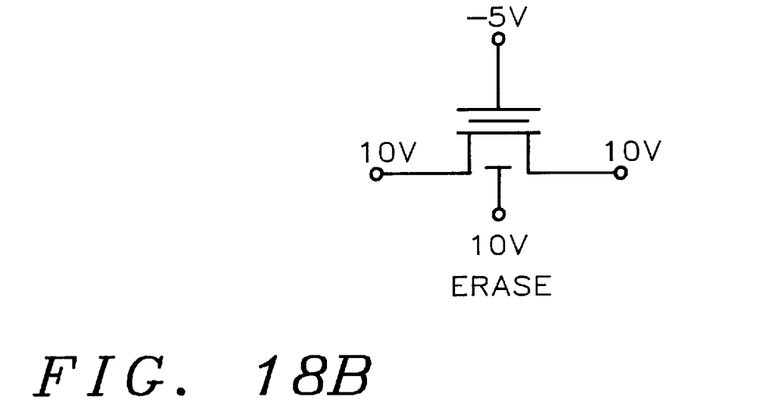
FIG. 18B shows a schematic diagram of a flash memory device in accordance with FIGS. 15A and 15B in the erase mode, with the ERASE voltages for a device in accordance with Table I.

FIG. 18B shows a schematic diagram of a flash memory device in accordance with FIGS. 15A and 15B in the erase mode, with the ERASE voltages for a device in accordance with Table I. The source and drain lines SSL and SDL provide a voltage of Volts at the source S (40a) and the drain D (40b). The word line WL1 is at a voltage of −5 Volts. The selected body line SBODL (14a, channel C) is at 10 Volts, and the deep N well DNW (12) is at 10 Volts.

Figure 18C:
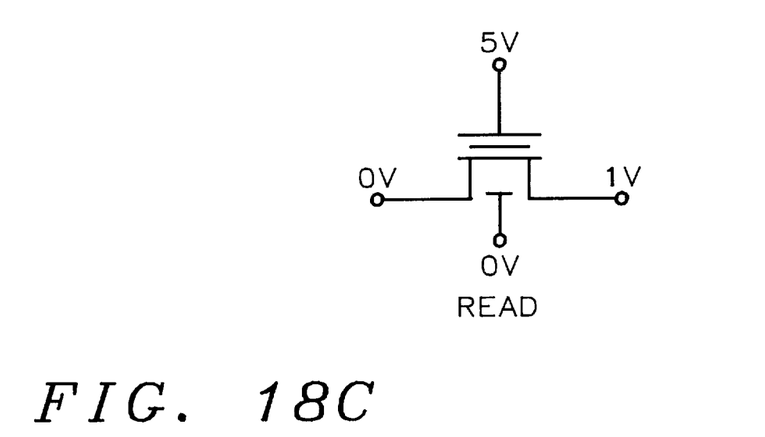
FIG. 18C shows a schematic diagram of a flash memory device in accordance with FIGS. 15A and 15B in the read mode, with the READ voltages for a device in accordance with Table I.

FIG. 18C shows a schematic diagram of a flash memory device in accordance with FIGS. 15A and 15B in the read mode, with the READ voltages for a device in accordance with Table I. The source and drain lines provide a 1 V voltage at the source 40a and 0 V at the drain 40b. The word line WL1 is at a 5 V voltage. The body line 14a (channel) voltage is 0 V, and the deep N well 12 voltage is 0 V.

An advantage of the cell of FIGS. 14, 15A and 15B is that the device can perform channel program and channel erase in a NOR-type flash circuit. The cell can be easily scaled down due to the use of channel program and erase instead of source erase and/or drain program. A reason the cell size can be scaled down is that there is no large voltage difference across the source region and the drain region during programming.

Figure 16A:
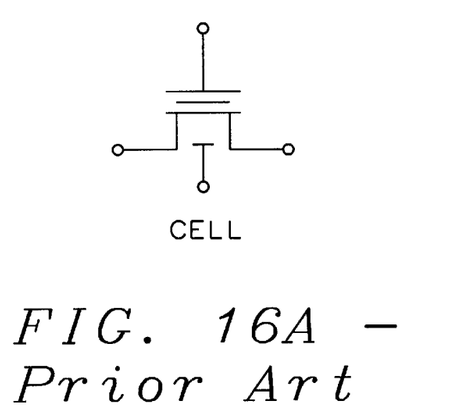
FIG. 16A shows the conventional cell notation for a flash memory cell.

FIG. 16A shows the conventional cell notation for a flash memory cell.

Figure 16B:
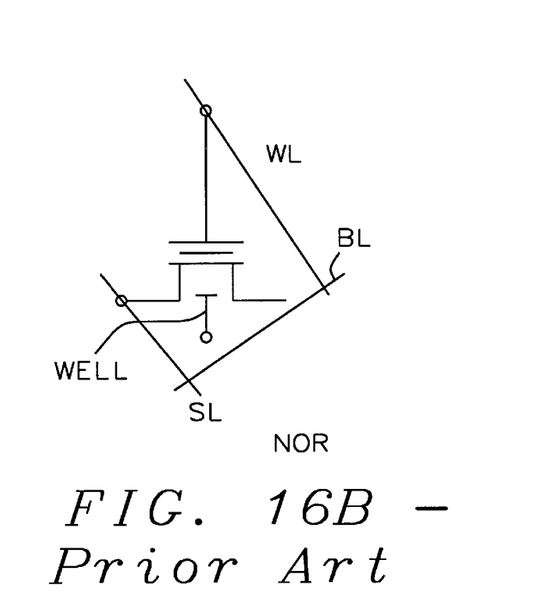
FIG. 16B shows the conventional cell notation for a flash memory NOR cell with the metal bit line connected to the drain, the diffusion SL source line connected adjacently forming a diffusion line, as well as, the polycide word line WL connected adjacently forming a control gate line. The well is a common connection line.

FIG. 16B shows the conventional cell notation for a flash memory NOR cell with the metal bit line connected to the drain, the diffusion SL source line connected adjacently forming a diffusion line, as well as, the polycide word line WL connected adjacently forming a control gate line. The well is a common connection line.

Figure 16C:
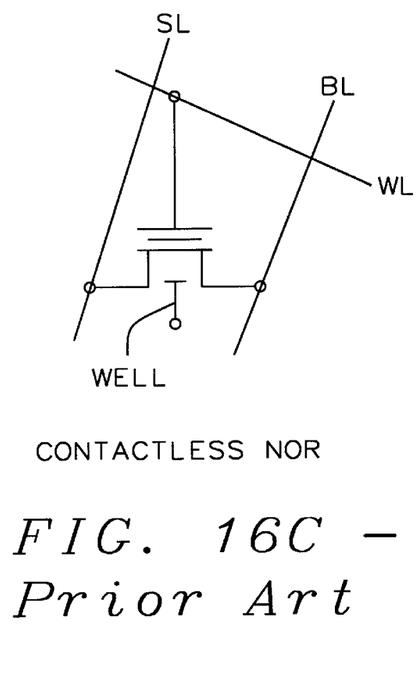
FIG. 16C shows the conventional cell notation for a contactless, flash memory NOR cell with the source line connected adjacently to the diffusion source, the metal bit line connected to the drain and the polycide word line connected to the control gate. The well is again a common connection line.

FIG. 16C shows the conventional cell notation for a contactless, flash memory NOR cell with the source line connected adjacently to the diffusion source, the metal bit line connected to the drain and the polycide word line connected to the control gate. The well is again a common connection line.

Figure 17:
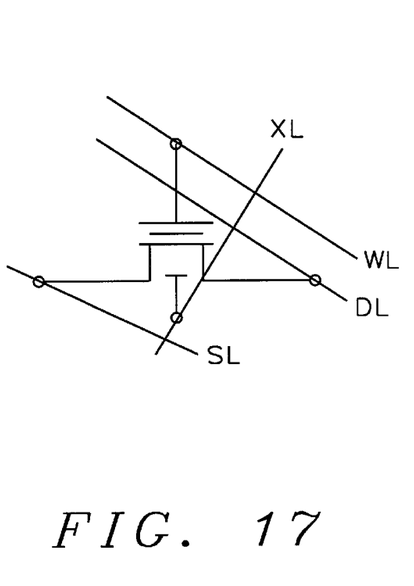
FIG. 17 shows cell notation for a flash memory cell. A source line SL is connected to cell source, drain line connected to cell drain, the word line WL connected to cell control gate, and the well line XL connected to adjacent cell well in a direction shown in FIG. 17.

FIG. 17 shows cell notation for a flash memory cell. A source line SL is connected to cell source, drain line connected to cell drain, the word line WL connected to cell control gate, and the well line XL connected to adjacent cell well in a direction shown in FIG. 17. (Please refer to FIG. 15A.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

We claim:

1. A raised-bitline, flash memory device with deep trenches comprising:

a semiconductor substrate doped with a first conductivity type, a first well of an opposite conductivity type, said first well comprising a deep conductor line to said device, a second well of said first conductivity type above said first well comprising a body conductor line to said device, said deep trenches extending through said second well into said first well, said deep trenches being filled with a first dielectric layer having a top surface, gate electrode stacks for a flash memory device including a gate oxide layer over said device, doped polysilicon floating gates formed over said gate oxide layer, an interpolysilicon dielectric layer formed over said floating gate electrodes, and control gate electrodes formed of doped polysilicon layer over said interpolysilicon dielectric layer, said gate electrode stacks having sidewalls, a dielectric cap over said control gate electrodes, source/drain regions in said second well self-aligned with said gate electrode stacks as well as spacer dielectric structures formed adjacent to said sidewalls of said stacks, said source/drain regions having top surfaces, and a third doped polysilicon layer patterned into raised, flat planar bitline bars located in a raised location on the surface of said source/drain regions and on said top surface of said first dielectric layer, said bitlines being in direct mechanical contact with said source/drain regions providing electrical interconnection to said source/drain regions.

2. A device in accordance with claim 1 wherein: a gate line connected to said control gate electrode and said body conductor line provides cell operation selection.

3. A device in accordance with claim 1 wherein cell operation voltages are as follows:

|  | Program | Erase | Read |
|---|---|---|---|
| Selected Word Line (SWL) | 8~9 V | −5 V | 5 V |
| Unselected Word Line (UWL) | 0 V | 0 V | 0 V |
| Selected Body Line (SBODL) | −5~−6 V | 10 V | 0 V |
| Unselected Body Line (UBODL) | 0 V | 5~6 V | −5 V |
| Selected Drain Line (SDL) | 0 V | 10 V | 1 V |
| Selected Source Line (SSL) | 2–3 V | 10 V | 0 V |
| Deep N Well (DNW) | −5~−6 V | 10 V | 0 V. |

4. A device in accordance with claim 1 wherein: said source/drain regions which are self-aligned with said spacers and have a dopant concentration from about 5E19 atoms/cm$^3$ to about 5E20 atoms/cm$^3$.

5. A device in accordance with claim 1 wherein: adjacent to said source/drain regions are N− lightly doped source/drain regions self-aligned with said gate electrode stacks having a concentration of said dopant from about 5E17 atoms/cm$^3$ to about 5E18 atoms/cm$^3$.

6. A device in accordance with claim 1 wherein said source/drain regions being self-aligned with said spacers having a dopant concentration from about 5E19 atoms/cm$^3$ to about 5E20 atoms/cm$^3$ with N− lightly doped source/drain regions self-aligned with said gate electrode stacks and being located adjacent to said source/drain regions, with said N− lightly doped source/drain regions having a dopant concentration from about 5E17 atoms/cm$^3$ to about 5E18 atoms/cm$^3$.

7. A device in accordance with claim 1 wherein: said interpolysilicon dielectric comprises an oxide/nitride/oxide layer comprising a silicon oxide layer having a thickness of from about 60 Å to about 80 Å, a silicon nitride layer having a thickness of from about 80 Å to about 100 Å, and another silicon oxide having a thickness from about 60 Å to about 80 Å.

8. A device in accordance with claim 1 wherein:
said interpolysilicon dielectric comprises an oxide/nitride/oxide layer comprising a silicon oxide layer having a thickness of from about 60 Å to about 80 Å, a silicon nitride layer having a thickness of from about 80 Å to about 100 Å, and another silicon oxide having a thickness from about 60 Å to about 80 Å,
source/drain regions which are self-aligned with said spacers have a dopant concentration from about 5E19 atoms/cm$^3$ to about 5E20 atoms/cm$^3$ with N− lightly doped source/drain regions located adjacent to said source/drain regions with a dopant concentration from about 5E17 atoms/cm$^3$ to about 5E18 atoms/cm$^3$.

9. A device comprising a raised-bitline, flash memory device with deep trenches comprises:
a semiconductor substrate doped with a first P− conductivity type, a first well of an opposite N− conductivity type,
a second well of said first P− conductivity type formed over said first well,
said deep trenches formed with a depth of from about 8 μm to about 10 μm and a width from about 0.3 μm to about 0.5 μm extending through said second well into said first well,
said deep trenches being filled with a blanket, first dielectric layer comprising a BPSG planarized glass layer having a top surface with a thickness of from about 10 μm to about 12 μm, said BPSG layer being composed of boron (B) from about 1% to about 12% and phosphorous (P) from about 4% to about 6%,
a gate oxide layer formed over said device having a thickness from about 80 Å and about 90 Å,
a first doped polysilicon formed layer over said gate oxide layer having a thickness from about 1,500 Å and about 1,800 Å,
said first doped polysilicon layer being patterned,
an interpolysilicon dielectric (IPD) layer formed over first doped polysilicon layer, said IPD layer comprising an oxide/nitride/oxide layer comprising a silicon oxide layer having a thickness of from about 60 Å to about 80 Å, a silicon nitride layer having a thickness of from about 80 Å to about 100 Å, and another silicon oxide having a thickness from about 60 Å to about 80 Å,
a second doped polysilicon layer formed over said interpolysilicon dielectric layer having a thickness from about 1,500 Å and about 2,000 Å,
a polycide layer composed of tungsten silicide formed over said second doped polysilicon layer having a thickness from about 100 Å and about 180 Å,
dielectric cap layers formed over said polycide layer, said dielectric cap layers comprising a blanket thin pad oxide layer composed of silicon dioxide from about 200 Å to about 400 Å thick and a blanket silicon nitride layer from about 800 Å to about 1,000 Å thick,
said device having gate electrode stacks for a flash memory device formed with said cap layers on top,
said gate electrode stacks having sidewalls,
N− lightly doped source/drain regions formed in said second well self-aligned with said gate electrode stacks with a dopant concentration from about 5E17 ions/cm$^3$ to about 5E18 ions/cm$^3$,
spacer dielectric structures formed adjacent to said sidewalls of said stacks,
source/drain regions formed in said second well which are self-aligned with said spacers having a dopant concentration from about 5E19 atoms/cm$^3$ to about 5E20 atoms/cm$^3$, said source/drain regions having top surfaces, and
a third doped polysilicon layer formed over said device, said third doped polysilicon layer being patterned into flat, raised bitline bars on said top surfaces of said source/drain regions and said top surface of said first dielectric layer, to form raised bitlines having a thickness between about 0.2 μm and about 0.3 μm, said bitlines being in direct mechanical contact with said source/drain regions and providing electrical interconnection to said source/drain regions.

* * * * *